United States Patent [19]

Kusuda et al.

[11] Patent Number: 5,245,198
[45] Date of Patent: Sep. 14, 1993

[54] OPTOELECTRONIC DEVICE, METAL MOLD FOR MANUFACTURING THE DEVICE AND MANUFACTURING METHOD OF THE DEVICE USING THE METAL MOLD

[75] Inventors: Kazuo Kusuda, Shiki; Katsunori Makiya, Nara, both of Japan

[73] Assignee: Sharp Kabushiki Kaisha, Osaka, Japan

[21] Appl. No.: 772,883

[22] Filed: Oct. 8, 1991

[30] Foreign Application Priority Data

Oct. 12, 1990 [JP] Japan .............................. 2-107099[U]
Oct. 12, 1990 [JP] Japan .................................. 2-274459

[51] Int. Cl.⁵ ........................................ G02B 27/00
[52] U.S. Cl. ...................................... 250/551; 257/82
[58] Field of Search .............. 250/551, 239, 227.11; 357/19; 257/82

[56] References Cited

U.S. PATENT DOCUMENTS

| | | | |
|---|---|---|---|
| 4,058,821 | 11/1977 | Miyoshi et al. | 250/551 |
| 4,136,351 | 1/1979 | Sugawara et al. | 250/551 |
| 4,446,375 | 5/1984 | Aird | 250/551 |
| 4,712,017 | 12/1987 | Kamasaki | 250/551 |
| 4,719,358 | 1/1988 | Matsumoto et al. | 250/551 |

FOREIGN PATENT DOCUMENTS

| | | |
|---|---|---|
| 2118391 | 12/1971 | Fed. Rep. of Germany . |
| 2304148 | 8/1974 | Fed. Rep. of Germany . |
| 59-132176 | 7/1984 | Japan . |

OTHER PUBLICATIONS

Informationsschrift of the Company Hewlett Packard 5952-0466 Apr. 1974 Dual Channel Hermetically Sealed Optically Coupled Isolator. U.S.A.

Primary Examiner—David C. Nelms
Assistant Examiner—T. Davenport
Attorney, Agent, or Firm—Nixon & Vanderhye

[57] ABSTRACT

An optoelectronic device comprising: a plurality of light emitting elements; light receiving elements, each light receiving element facing a light emitting element; a lead made of a thin metal plate and having the light receiving elements fixed thereon, the lead being connected by wires to ground electrodes provided on the light receiving elements; a plurality of ground terminals common to the light receiving elements and integrated with the lead; an inner package, made of translucid resin, for separately sealing each pair of the facing light emitting elements and light receiving elements; and a package, made of resin having light interrupting properties, for sealing the entire inner package. Also, a metal mold that can simultaneously mold a plurality of the inner packages; and a manufacturing method of the optoelectronic device using the metal mold, comprising the steps of: molding the inner package; and then molding the package. Accordingly, a miniature optoelectronic device which has a small number of terminals and in which no crosstalk occurs can be achieved and efficiently manufactured.

21 Claims, 10 Drawing Sheets

OPTOELECTRONIC DEVICE, METAL MOLD FOR MANUFACTURING THE DEVICE AND MANUFACTURING METHOD OF THE DEVICE USING THE METAL MOLD

FIELD OF THE INVENTION

The present invention relates to an optoelectronic device provided with a plurality of photocouplers in a package, and more specifically to the configuration of the optoelectronic device, a metal mold for manufacturing the optoelectronic device and a manufacturing method of the optoelectronic device using the metal mold.

BACKGROUND OF THE INVENTION

A photocoupler essentially consists of a light emitting element and a light receiving element which are electrically isolated but optically coupled. When an electric signal is entered into the photocoupler, the electric signal is first converted into an optical signal by the light emitting element. This optical signal is reconverted into an electric signal by the light receiving element. Then, the reconverted electric signal is released by the photocoupler.

The photocoupler is used for example when an external input/output device is connected to a programmable controller. The photocoupler makes it possible to connect the programmable controller and the external input/output device even if the respective input and output levels are different. This becomes possible because the two can be kept electrically isolated from each other when connected via the photocoupler.

Normally, over 64 photocouplers are required in order to connect a programmable controller and an external input/output device. To reduce the number of parts, an optoelectronic device comprising a plurality of photocouplers sealed in a package is currently in use.

Figure 10:
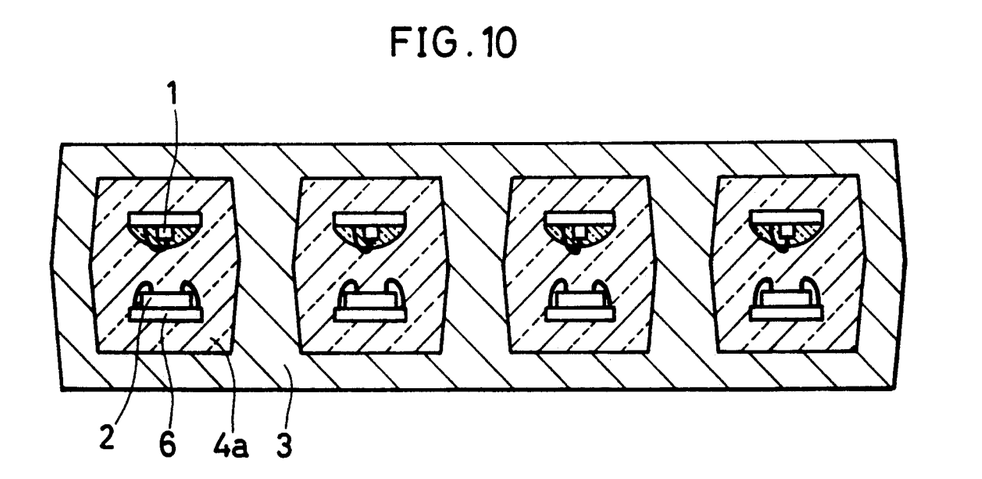
FIG. 10 is a vertical sectional view of an optoelectronic device provided with a plurality of inner packages.
Figure 11:
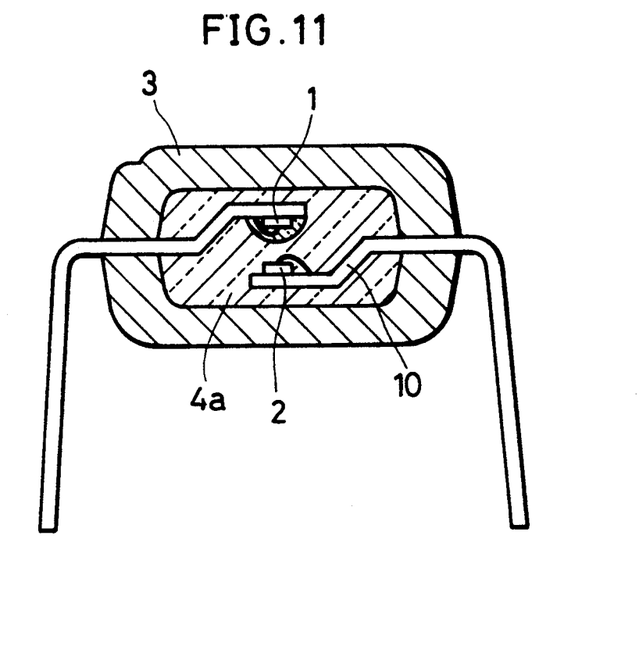
FIG. 11 is a vertical sectional view of the optoelectronic device shown in FIG. 10, this vertical sectional view being orthogonal to that shown in FIG. 10.

An example of an optoelectronic device is shown in FIGS. 10 and 11. This optoelectronic device comprises four photocouplers in a package 3 made of resin having light interrupting properties. Each photocoupler has a light emitting element 1 and a light receiving element 2, disposed so as to face each other, the pair of the light emitting element 1 and the light receiving element 2 being sealed in an inner package 4a made of translucid resin.

Figure 12:
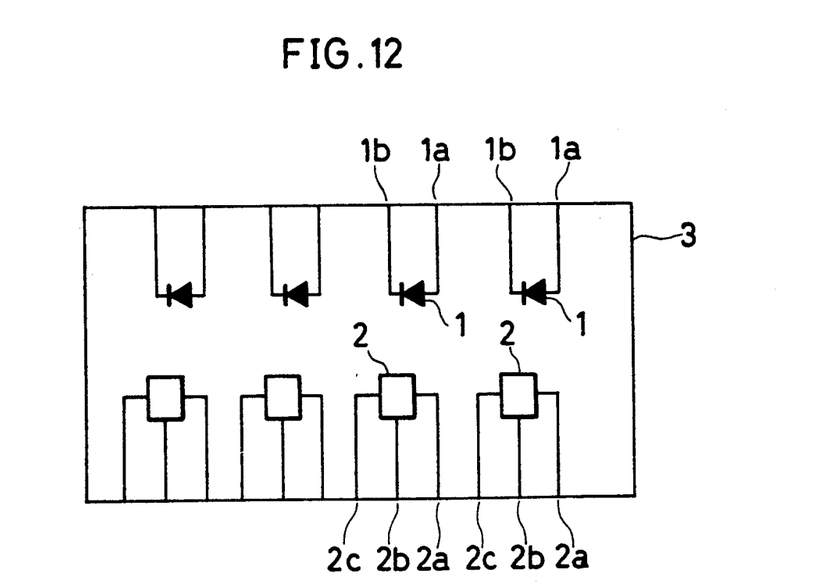
FIG. 12 is a wiring diagram of the optoelectronic device shown in FIG. 10.

As shown in FIG. 12, the light emitting element 1 requires a positive terminal 1a and a negative terminal 1b, and the light receiving element 2 requires a ground terminal 2a, an output terminal 2b, and a power terminal 2c. Consequently, the optoelectronic device has a total of 20 terminals.

In order to miniaturize the optoelectronic device, it is desirable that the number of terminals be as small as possible. Accordingly, it is conceivable that, instead of providing the ground terminal 2a and the power terminal 2c on each of the light receiving elements 2, a ground terminal and a power terminal common to all the light receiving elements 2 be provided thereon.

Figure 13:
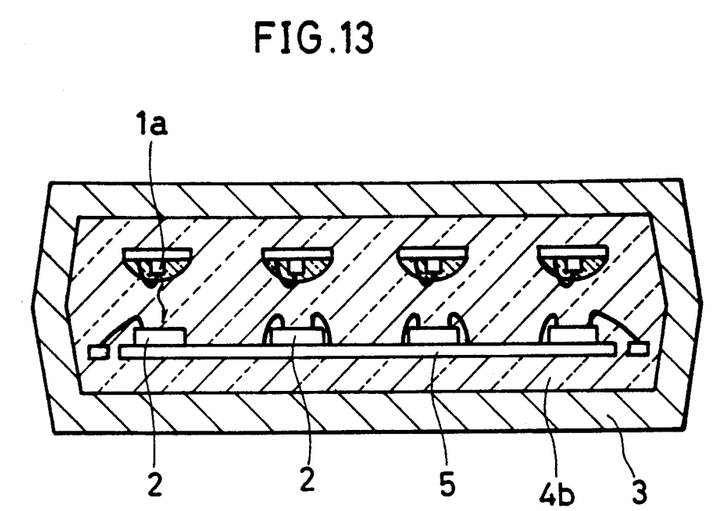
FIG. 13 is a vertical sectional view of an optoelectronic device provided with one inner package.

The number of the terminals used can be reduced, if for example, as shown in FIG. 13, ground electrode sections of the four light receiving elements 2 are respectively connected to a lead 5 provided in the package 3 and the lead 5 is drawn out as a ground terminal common to all the light receiving elements 2 (a ground electrode section is provided on each of the four light receiving elements 2). Miniaturization thereby becomes possible.

However, if the four photocouplers are disposed in the inner package 4b made of the translucid resin, light (shown for example by the arrow in FIG. 13) from one of the light emitting elements 1 is incident not only upon the facing light receiving element 2 but also upon the neighboring light receiving elements 2. As a result, there is a danger of the neighboring light receiving elements 2 malfunctioning. In other words, there exists a problem of crosstalk between photocouplers.

Figure 14:
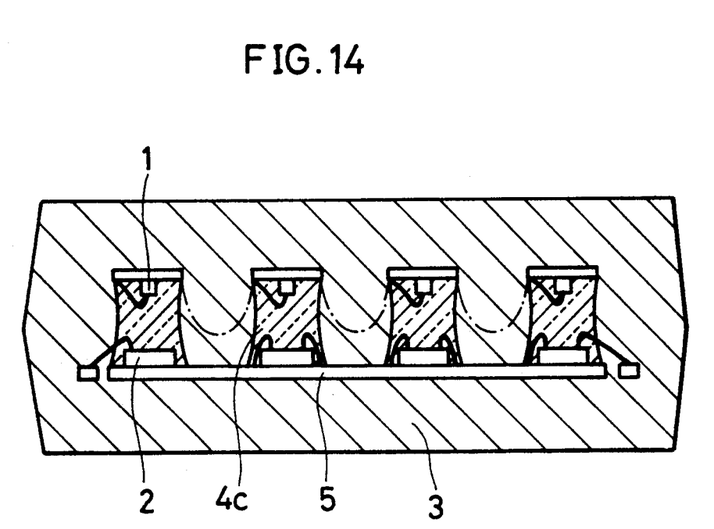
FIG. 14 is a vertical sectional view of an optoelectronic device provided with a light path between a light emitting element and a light receiving element.
Figure 15:
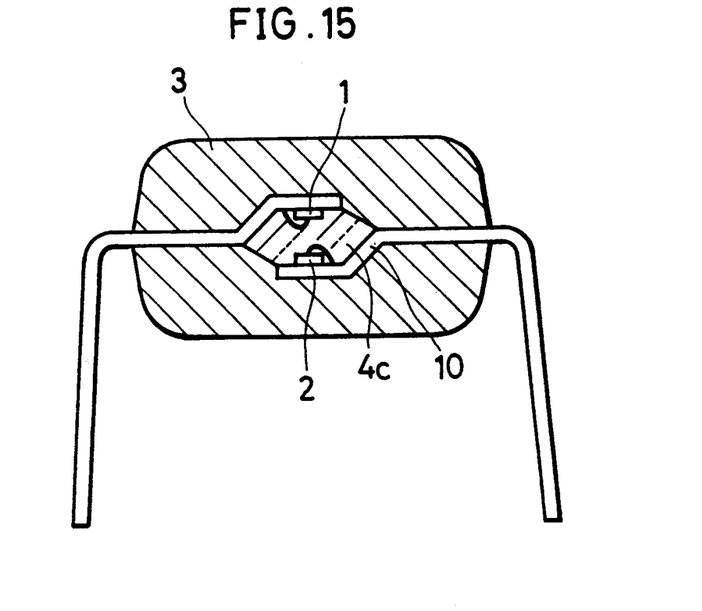
FIG. 15 is a vertical sectional view of the optoelectronic device shown in FIG. 14, this vertical sectional view being orthogonal to that shown in FIG. 14.

In order to prevent this from occurring, it is conceivable, as shown in FIGS. 14 and 15, that a light path 4c made of translucid resin be provided only between each of the pairs of the facing light emitting elements 1 and the light receiving elements 2, the entire body being sealed in the package 3 made from the resin having light interrupting properties.

However, during manufacturing, the light paths 4c may become joined, as shown by alternate long and short dash lines in FIG. 14. That is, there is still a possibility of light leaking from the light emitting elements 1 to neighboring light receiving elements 2.

In order to prevent this from happening, a light interrupting wall made of resin having light interrupting properties can be provided between neighboring light receiving elements 2, the translucid resin being introduced thereafter. However, since this increases the number of processing steps, a new problem arises in that the manufacturing cost increases.

Figure 16:
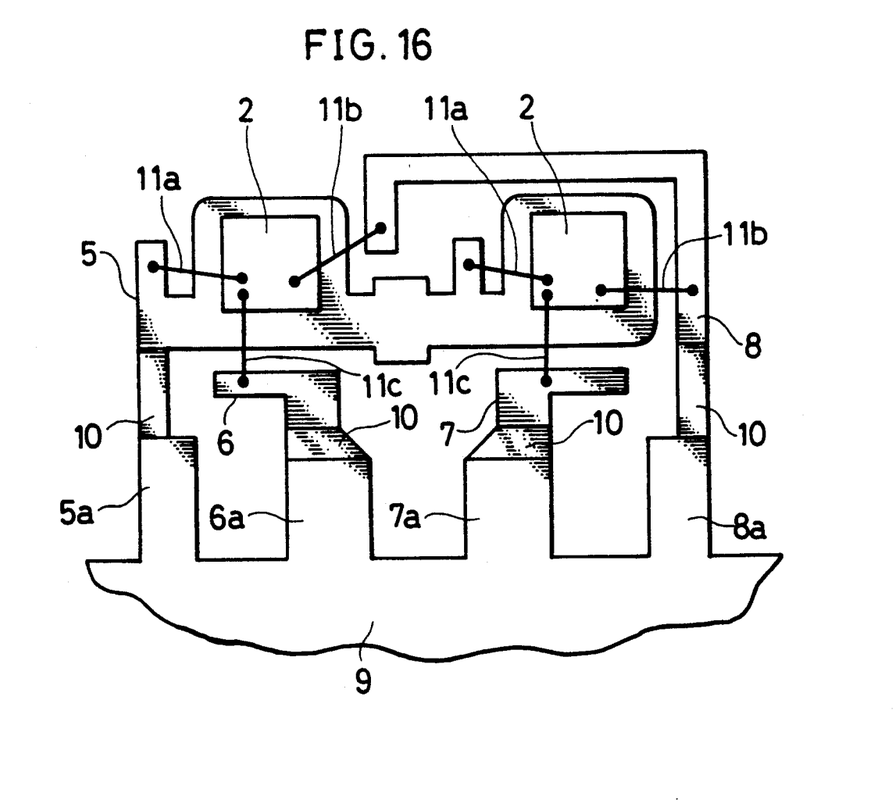
FIG. 16 is a plan view showing the configuration of a lead frame.

A lead frame is used in the manufacture of the optoelectronic device. For simplicity, FIG. 16 shows a lead frame having two light receiving elements 2 provided thereon.

The lead frame is made from a thin metal plate and comprises a tie bar 9 and four leads 5, 6, 7 and 8 which extend from the tie bar 9. The light receiving elements 2 are fixed onto the lead 5 by die bonding. Wiring is carried out by wire bonding. That is, a ground electrode of each of the light receiving elements 2 is connected to the lead 5 by a wire 11a. A power electrode of each of the light receiving elements 2 is connected to the lead 8 by a wire 11b. Output electrodes of the light receiving elements 2 are connected respectively the leads 6 and 7 by a wire 11c, one output electrode being provided on each light receiving element 2. When the tie bar 9 is cut away from the lead frame, a ground terminal 5a common to the two light receiving elements 2, two output terminals 6a and 7a, and a power terminal 8a common to the two light receiving elements 2 are achieved.

Bent sections 10 (see FIG. 11 or FIG. 15) are provided in the leads 5, 6, 7, and 8 in order to provide a space between each facing pair of the light emitting element 1 and the light receiving element 2. However, if an error occurs in the bend angle of any of the bent sections 10, a predetermined space can no longer be maintained. This results in a fall in the output of the light receiving element 2 or a fall in the withstand voltage of the optoelectronic device. Moreover, the longer the lead 5, the greater is the displacement of the light receiving element 2. Therefore, it is difficult to make the lead 5 longer than shown, if the optoelectronic device is to operate normally. This means that it is difficult to have three or more light receiving elements 2 on the lead 5. In other words, it is difficult to manufacture an optoelectronic device provided with three or more photocouplers.

Further, although an optoelectronic device having two or more lead frames is conceivable, setting two or more lead frames accurately and fixing these in translucid resin is problematic. Manufacturing efficiency is lowered and a high-precision optoelectronic device cannot be achieved.

SUMMARY OF THE INVENTION

An object of the present invention is to provide a miniature optoelectronic device which has a small number of terminals, the optoelectronic device comprising a plurality of photocouplers sealed in a package, the photocouplers having pairs of light emitting element and light receiving elements disposed facing each other.

In order to achieve the above object, the optoelectronic device of the present invention is characterized in comprising: a plurality of light emitting elements for converting electric signals into optical signals; light receiving elements, each disposed so as to face a light emitting element, for reconverting the optical signals into electric signals; a lead made from a metal plate, the light receiving elements being adhered thereon and the lead being connected by wires to ground electrodes provided on the light receiving elements; and a plurality of ground terminals common to the light receiving elements, the plurality of the ground terminals being integrated with the lead.

With the above arrangement, the number of terminals decreases since the ground terminals are common to the light receiving elements. Furthermore, since the lead whereon the light receiving elements are to be adhered is integrated with the plurality of ground terminals, the light receiving elements provided on the lead are supported by the plurality of ground terminals. Accordingly, when manufacturing the optoelectronic device, a constant space is easily achieved between each facing pair of the facing light emitting element and the light receiving element. Thus, a miniature optoelectronic device having a stable performance can be manufactured.

Another object of the present invention is to provide a metal mold for sealing each of a plurality of photocouplers provided in a package in a miniature optoelectronic device, which has a small number of terminals, with an inner package made of translucid resin.

In order to attain this object, the metal mold used for molding the inner package of the optoelectronic device of the present invention is characterized in comprising an upper mold which has cavity sections for molding an upper section of the inner package, there being as many cavity sections as there are light receiving elements; and a lower mold which has cavity sections for molding a lower section of the inner package, there being as many cavity sections in the lower mold as there are cavity sections in the upper mold.

With the above arrangement, a plurality of inner packages can be simultaneously molded by charging the translucid resin into cavities formed when the upper mold and the lower mold are brought together. This is possible because there are as many cavities as there are light receiving elements, each of the cavities conforming to the shape of the inner package.

Another object of the present invention is to provide a manufacturing method of a miniaturized optoelectronic device having a small number of terminals and provided with a plurality of photocouplers in a package, the manufacturing method comprising the steps of sealing each of the photocouplers in an inner package made of translucid resin, and then sealing the inner package in the package made of resin having light interrupting properties.

In order to attain this object, the manufacturing method of the optoelectronic device of the present invention is characterized in using the metal mold, and in comprising the steps of, first setting a pair of a light emitting element and a light receiving element in each of the cavities formed by the upper mold and the lower mold, and molding an inner package by charging translucid resin into the cavities of the metal mold, and then molding the package.

With the above arrangement, an optoelectronic device in which there is no crosstalk between photocouplers can be efficiently manufactured.

For a fuller understanding of the nature and advantages of the invention, reference should be made to the ensuing detailed description taken in conjunction with the accompanying drawings.

BRIEF DESCRIPTION OF THE DRAWINGS

FIGS. 1 to 9 show an embodiment of the present invention.

FIGS. 10 to 16 show a conventional example.

DESCRIPTION OF THE EMBODIMENTS

One embodiment of the present invention is described hereinbelow, referring to FIGS. 1 to 9.

Figure 2:
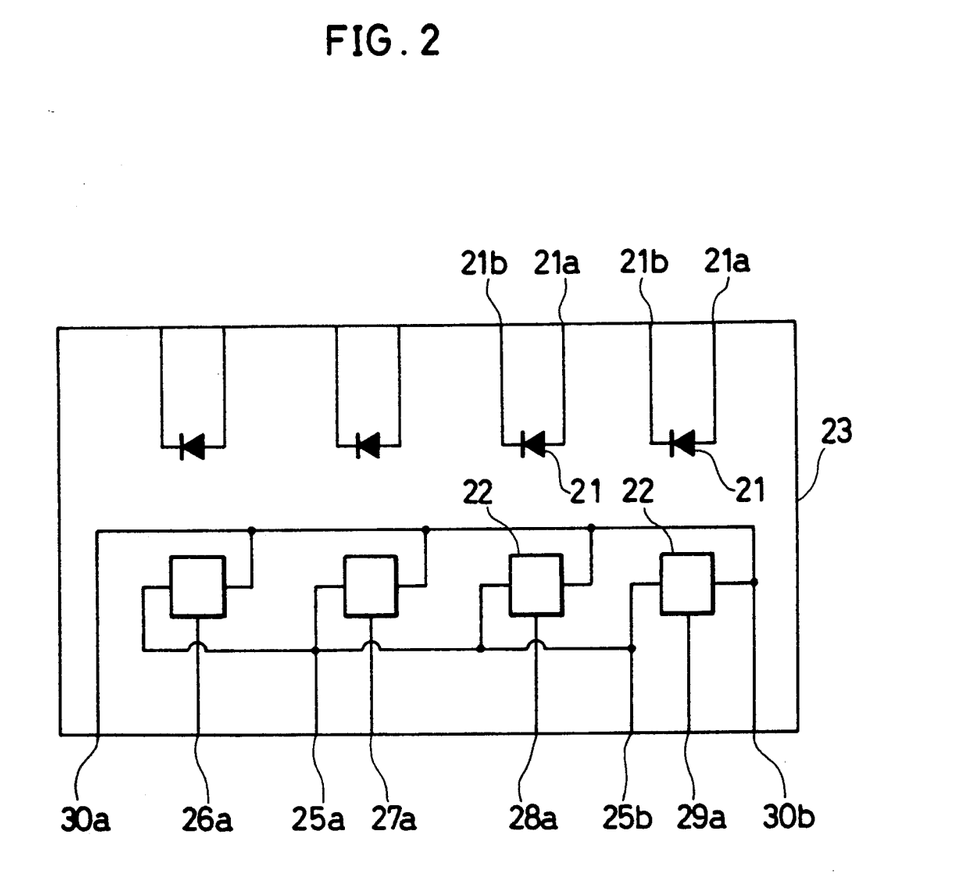
FIG. 2 is a wiring diagram of an optoelectronic device.
Figure 3:
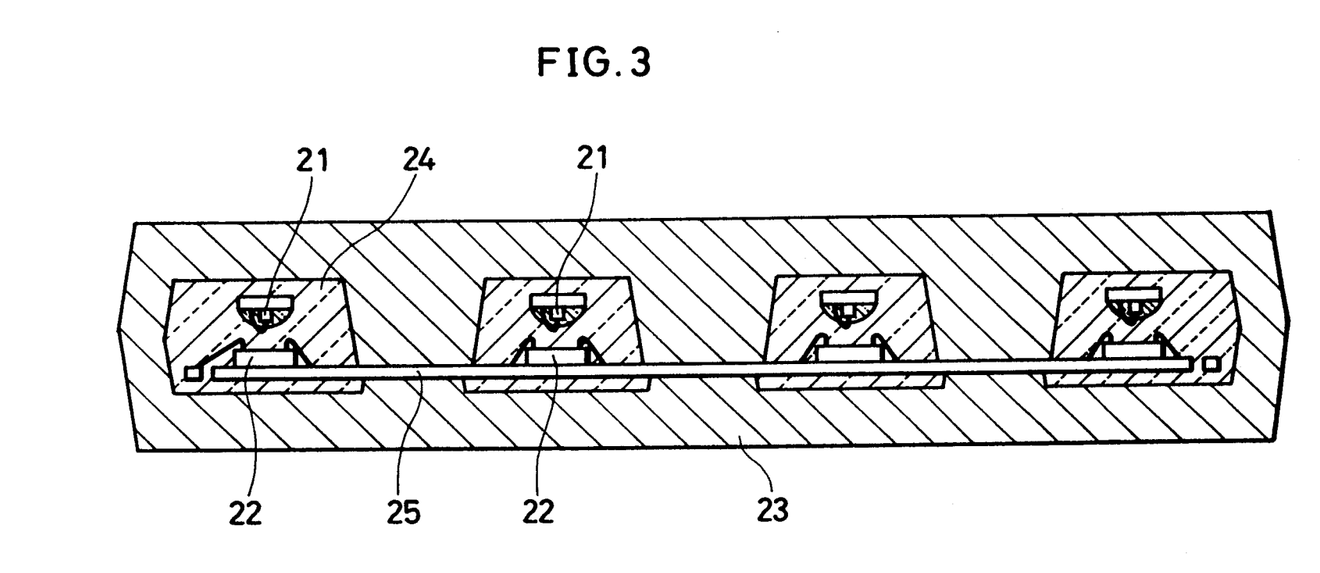
FIG. 3 is a vertical sectional view of the optoelectronic device.

As shown in FIGS. 2 and 3, an optoelectronic device of the present embodiment has four photocouplers provided in a package 23 made of resin having light interrupting properties. Each photocoupler has a light emitting element 21 and a light receiving element 22 which are disposed facing each other in an inner package 24 made of translucid resin. Each photocoupler is separately enclosed by the package 23 so as to prevent crosstalk from occurring between the photocouplers.

Ground terminals 25a and 25b are common to the four light receiving elements 22. Similarly, power terminals 30a and 30b are common to the four light receiving elements 22. The four output terminals 26a, 27a, 28a and 29a correspond respectively to the four light receiving elements 22. Each of the four light emitting elements 21 has a positive terminal 21a and a negative terminal 21b.

A lead frame made of a thin metal plate is used in the manufacture of the optoelectronic device.

Figure 1:
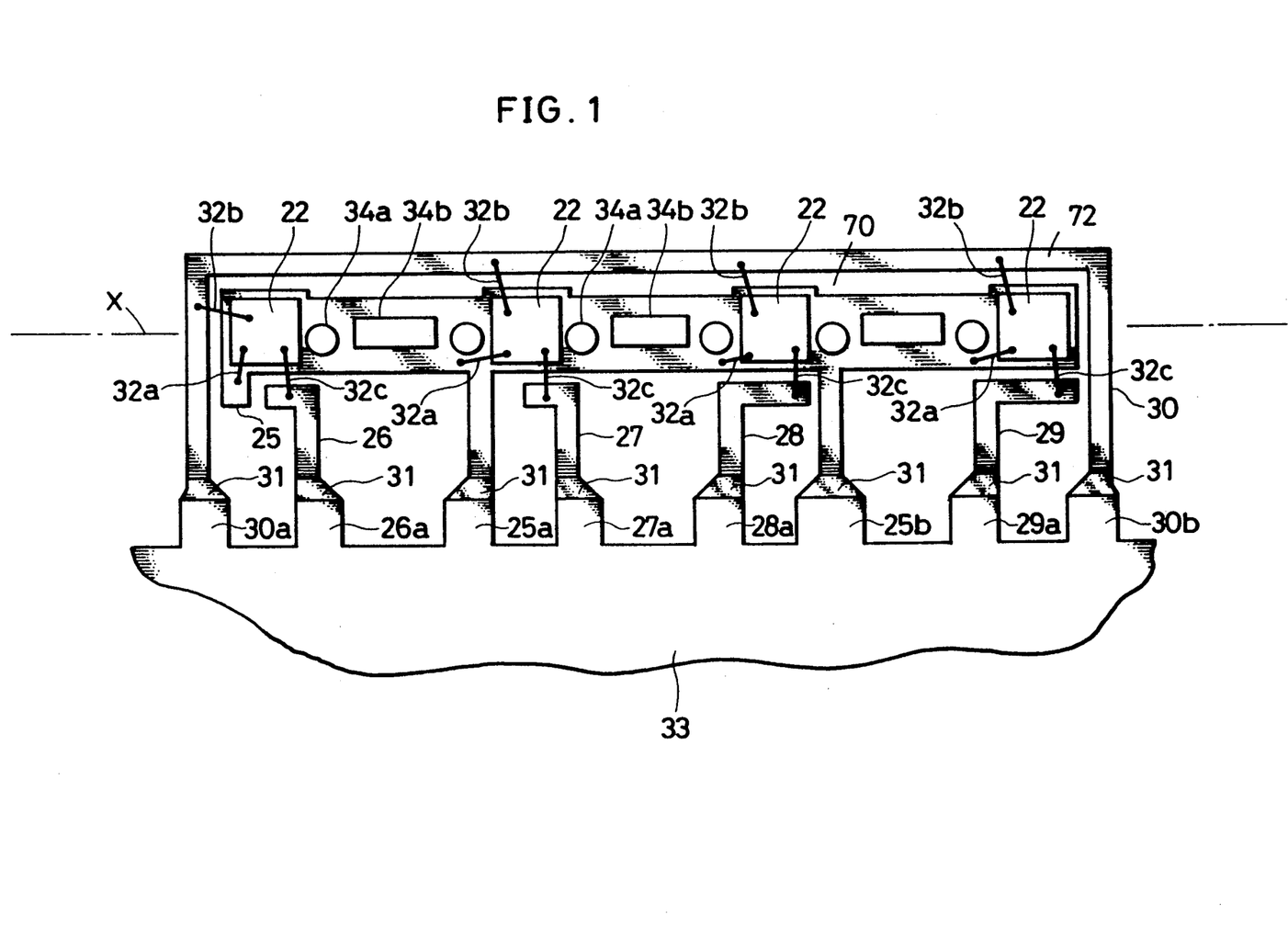
FIG. 1 is a plan view showing the configuration of a lead frame.

As shown in FIG. 1, the lead frame used for the light receiving elements 22 comprises a tie bar 33, and six leads 25, 26, 27, 28, 29 and 30 extending from the tie bar 33. The lead 25 extends from the tie bar 33 from two places. The lead 30 is disposed about the lead 25 and also extends from the tie bar 33 from two places. Each of the leads 26, 27, 28 and 29 extends from the tie bar 33 from only one place.

The light receiving elements 22 are fixed on the lead 25 by die bonding. Wiring is carried out by wire bonding. That is, a ground electrode of each of the light receiving elements 22 is connected to the lead 25 by a wire 32a. A power electrode of each of the light receiving elements 22 is connected to the lead 30 by a wire 32b. Output electrodes of the light receiving elements 22 are respectively connected to the leads 26, 27, 28, and 29 by wires 32c. When the tie bar 33 is cut away from the lead frame, the ground terminals 25a and 25b, the output terminals 26a, 27a, 28a and 29a, and the power terminals 30a and 30b are achieved.

In order to provide a space (see FIG. 3) between each pair of the light emitting elements 21 and the light receiving elements 22, a bent section 31 is provided on each of the leads 25, 26, 27, 28, 29 and 30. Further, in order to prevent distortion due to heat of the lead 25, which has the light receiving elements 22 provided thereon, circular holes 34a and rectangular holes 34b (see FIG. 1) are formed on the lead 25. The lead frame may be achieved by punching it out from a thin metal plate using a punching machine.

A lead frame (not shown) used for the light emitting elements 21 comprises eight leads extending from a tie bar. The light emitting elements 21 are respectively fixed on four of the leads. The remaining four leads lie between these leads so as to be located alternately with respect to them. An anode and a cathode of each of the light emitting elements 21 are respectively connected to two leads, one of the two leads having the light receiving elements 21 fixed thereon. When the tie bar is cut away from the lead frame, four positive terminals 21a (see FIG. 2) and four negative terminals 21b are achieved.

Thus, FIG. 1 shows a first elongated member 70 extending along an axis of elongation X and having a plurality of light receiving elements 22 mounted thereon. As shown in FIG. 1, the light receiving elements 22 are mounted in spaced-apart relation along the axis of elongation X. A first electrode (i.e., ground electrode) of each of the light receiving elements 22 is connected by wire bonding 32a to the first elongated member 70.

At least two bridge leads 25a, 25b (also herein referred to as "ground terminals") connect the first elongated member 70 to the tie bar member 33. The bridge leads 25a, 25b extend in a direction substantially orthogonal to the axis of elongation X.

A plurality of peninsular leads 26, 27, 28, and 29 extend from the tie bar member 33 to the first elongated member 70 in a direction substantially orthogonal to the axis of elongation X. Each peninsular lead 26, 27, 28, 29 correspond to an associated one of the light receiving elements 22 and is connected by wire bonding 32c to a second electrode (e.g., an output electrode) of the associated light receiving element 22.

FIG. 1 further shows a second elongated member 72 extending in a direction parallel to the axis of elongation X of the first elongated member 70. The second elongated member 72 is connected to the tie bar member 33 by at least two bridge leads 30a, 30b (also herein referred to as "power terminals"). A third electrode (e.g., power electrode) of each of the light receiving elements 22 is connected by wire bonding 32b to the second elongated member 72.

FIG. 1 also shows that, with respect to a direction orthogonal to the axis of elongation X of the first elongated member, the first elongated member 70 is positioned intermediate the second elongated member 72 and the tie bar 33. Likewise, the first elongated member 70 is positioned intermediate the second elongated member 72 on a first side and the peninsular leads 26, 27, 28, 29 on a second side. Moreover, with respect to the direction parallel to the axis of elongation X of the first elongated member 70, a plurality (e.g., two) of the peninsular leads (in particular leads 27, 28) are positioned intermediate the bridge leads 25a, 25b which connect the first elongated member 70 to the tie bar 33.

As stated previously, the first elongated member 70 has four light receiving elements 22 mounted thereon. With respect to a direction parallel to the axis of elongation X of the first elongated member 70, at least two peninsular leads (e.g., leads 27, 27) are positioned intermediate the bridge leads 25a, 25b which connect the first elongated member 70 to the tie bar 33. Moreover, with respect to a direction parallel to the axis of elongation X of the first elongated member 70, the bridge leads 25a, 25b connecting the first elongated member 70 to the tie member 33 and the peninsular leads 26, 27, 28, and 29 are all positioned intermediate two bridge leads 30a, 30b which connect the second elongated member 72 to the tie bar 33.

As shown in FIG. 1, the first elongated member 70 has poles or apertures 34a, 34b formed therein between the light receiving elements 22. Apertures 34b have an essentially rectangular shape. Apertures 34a have an essentially circular shape.

As stated above, the first elongated member 70, the second elongated member 72, the tie bar 33, the bridge members, and the peninsular members are all formed from a thin metal plate. The first elongated element 70 and the tie bar 33 lie in different planes, and the bridge leads and the peninsular leads are bent. The tie bar 33 is cut away from the remainder of the thin metal plate. 2) and four negative terminals 21b are achieved.

Specifically, a light emitting diode may be used as the light emitting element 21. A photodiode or a phototransistor may be used as the light receiving element 22. A delaying circuit or the like may be provided with the light receiving elements 22 in order to prevent chattering.

With the above arrangement, when electric signals are respectively entered into the light emitting elements 21 of the optoelectronic device, the electric signals are converted into optical signals by the light emitting elements 21. These optical signals are reconverted into electric signals by the light receiving elements 22, the reconverted electric signals being released by the optoelectronic device.

In the optoelectronic device of the present embodiment, since the ground terminals 25a and 25b and the power terminals 30a and 30b have been arranged to be common to all the light receiving elements 22, the number of terminals is small. This permits the package 23 to be miniaturized. Moreover, since the lead 25 extends from the tie bar 33 from two places, even if an error occurs in the bend angle of the bent section 10, the space between each of the pairs of the light emitting elements 21 and the light receiving elements 22 does not change so easily, compared to the case where the lead 25 extends from the tie bar 33 from one place. Consequently, a fall in the output of the light receiving elements 22 or in the withstand voltage of the optoelectronic device does not occur so easily. Thus, an optoelectronic device that has a stable performance can be manufactured.

Although in the lead frame, whereon the light receiving elements 22 are fixed, the lead 25 extends from the tie bar 33 from two places, it may extend from a larger number of places: this has the advantage of further decreasing the possibility of change occurring in the space between each pair of the light emitting elements 21 and the light receiving elements 22. However, the number of terminals should not become excessively large.

Figure 4:
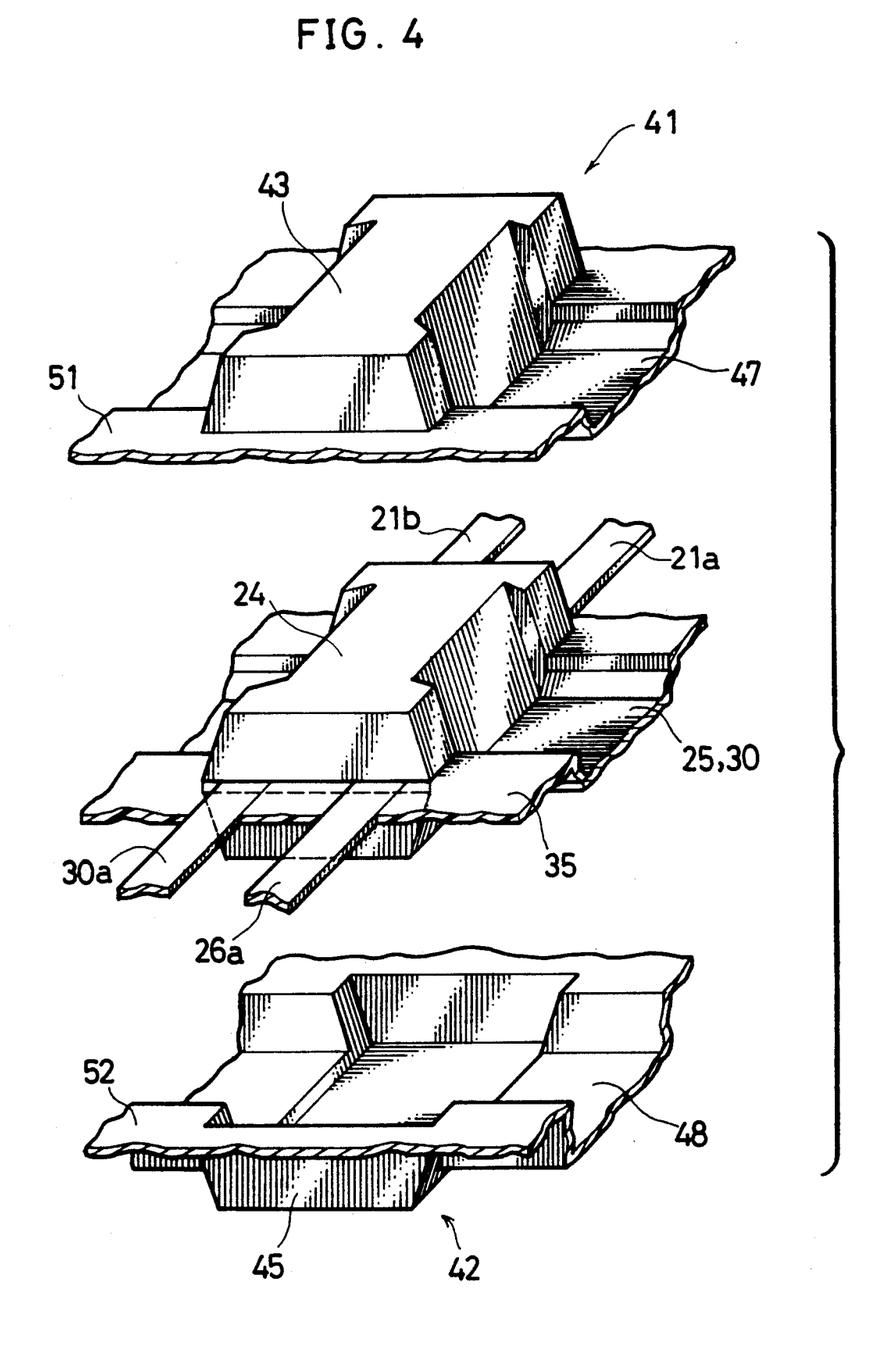
FIG. 4 is a perspective view of a first metal mold and an inner package.
Figure 5:
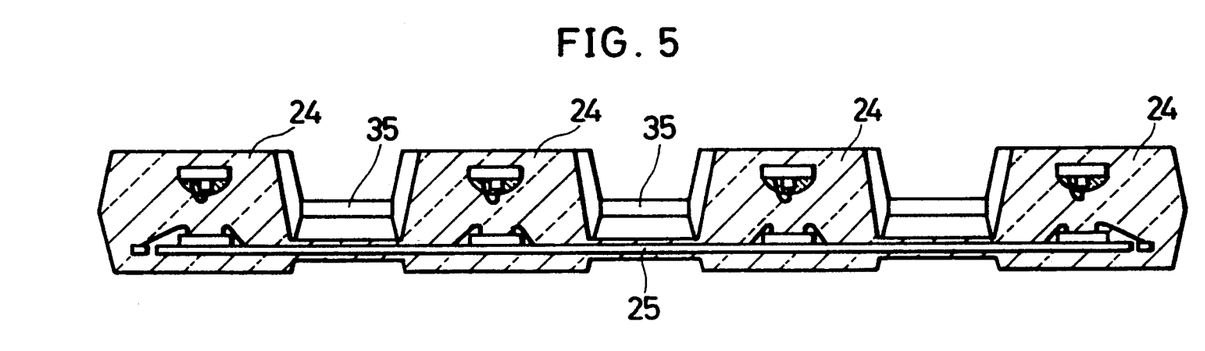
FIG. 5 is a vertical sectional view of the inner packages molded by the first metal mold.

A manufacturing method of the optoelectronic device is described hereinbelow, referring to FIGS. 3 to 5.

After the light receiving elements 22 have been fixed onto the lead 25 of the lead frame by die bonding, the ground electrodes, the power electrodes and the output electrodes of the light receiving elements 22 are connected to corresponding leads 25, 26, 27, 28, 29 and 30 by wire bonding (see FIG. 1).

Similarly, the light emitting elements 21 are fixed onto the lead frame (not shown) by die bonding and then the anodes and the cathodes of the light emitting elements 21 are connected to corresponding leads by wire bonding. After wire bonding has been carried out, the light emitting elements 21 are coated with junction coating resin for stress relief.

The two lead frames are either spot-welded together or fixed onto a loading frame in order that the light emitting element 21 and the light receiving element 22 of each pair be fixed so as to face each other.

In order to make the inner package 24, a pair of the lead frames is set in a first metal mold. Translucid resin is charged into the metal mold and four inner packages 24 are molded simultaneously by heating, as, shown in FIGS. 4 and 5. Semi-transparent epoxy resin may be used as material for the inner package 24.

After removing any flash that forms from the resin 35 between adjacent inner packages 24, the molded article is set in a second metal mold in order to form the package 23. Resin having light interrupting properties is then charged into the second metal mold and the package 23 is molded by heating, as shown in FIG. 3. Opaque epoxy resin may be used as material for the packages 23.

The configuration of the first metal mold is described hereinbelow referring to FIGS. 6 to 9.

Figure 6:
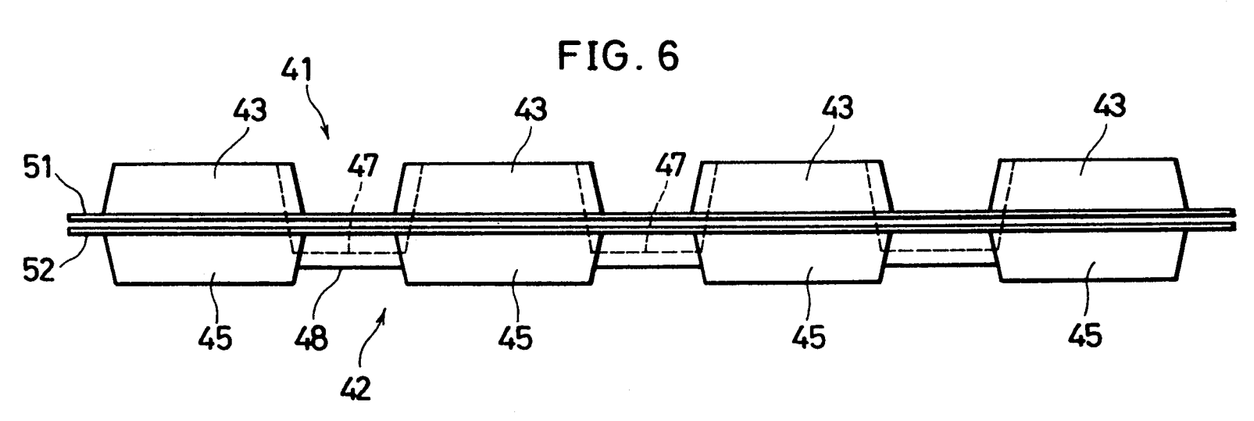
FIG. 6 is a front view of the first metal mold.

As shown in FIG. 6, the first metal mold comprises an upper mold 41 and a lower mold 42.

Figure 7:
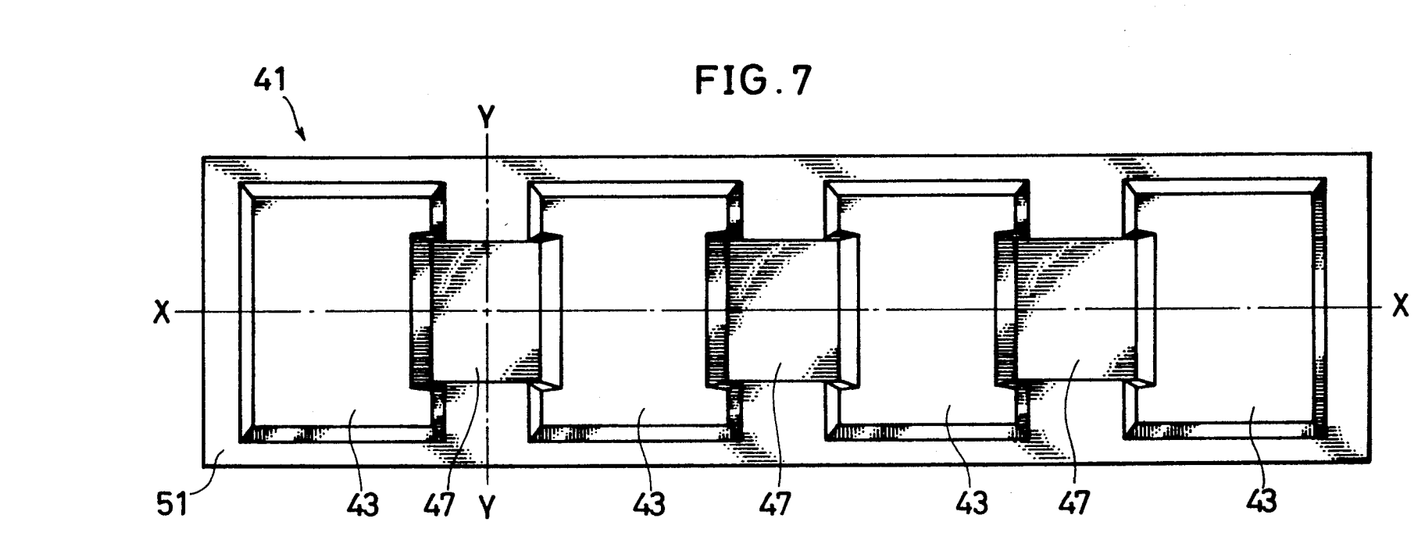
FIG. 7 is a plan view of the metal mold shown in FIG. 6.

As shown in FIG. 7, the upper mold 41 comprises: four cavity sections 43; projecting sections 47 which project downwards, provided between the cavity sections 43; and an upper plate 51 on which the cavity sections 43 and the projecting sections 47 are integrally formed.

The lower mold 42 comprises: four cavity sections 45; sunken sections 48 into which the projecting sections 47 fit, provided between the cavity sections 45; and a lower plate 52 on which the cavity sections 45 and the sunken sections 48 are integrally formed.

Figure 8:
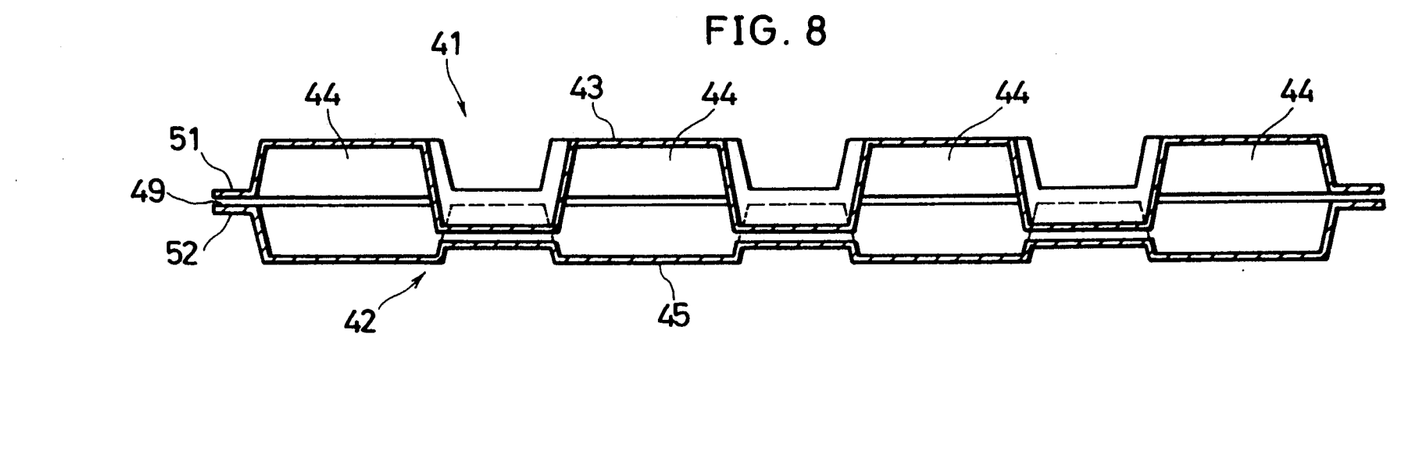
FIG. 8 is a vertical sectional view along the line X—X shown in FIG. 7.
Figure 9:
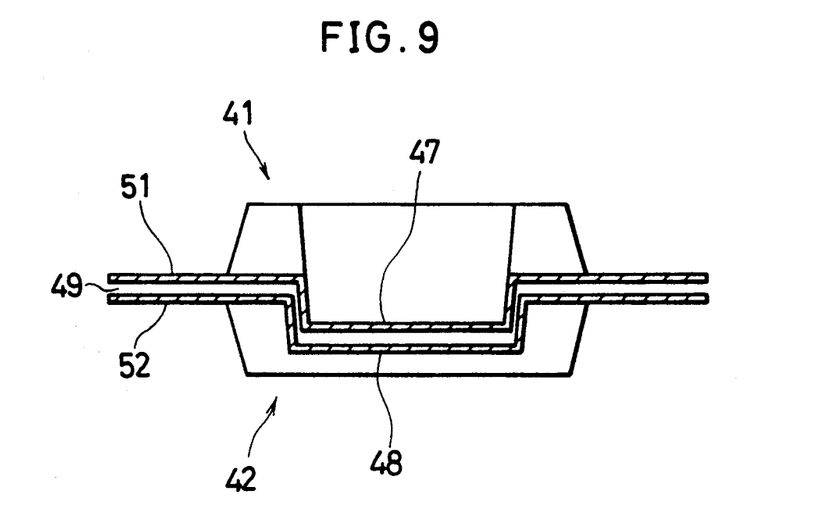
FIG. 9 is a vertical sectional view along the line Y—Y shown in FIG. 7.

As shown in FIG. 8, when the upper mold 41 and the lower mold 42 are brought together, they are designed to form four cavities 44 which conform to the shape of the inner package 24. Further, as shown in FIG. 9, the height of each of the projecting sections 47 and the depth of each of the sunken sections 48 are set so that a gap 49 which substantially conforms to the thickness of the lead frames is formed between the upper plate 51 and the lower plate 52.

With the above arrangement, when the pair of the lead frames is set between the upper mold 41 and the lower mold 42, the four cavities 44 are formed so as to separately envelop the facing pairs of the light emitting elements 21 and the light receiving elements 22. The leads 25 and 30 of the lead frame are sandwiched between the projecting sections 47 and the sunken sections 48. The ground terminals 25a and 25b, the power terminals 30a and 30b and the output terminals 26a, 27a, 28a and 29a of the light receiving elements 22 are sandwiched between the upper plate 51 and the lower plate 52 (see FIG. 4). Similarly, the positive terminal 21a and the negative terminal 21b of the light emitting elements 21 are also sandwiched between the upper plate 51 and the lower plate 52. The four inner packages 24 are then simultaneously molded by charging translucid resin into the cavity 44.

Accordingly, an optoelectronic device in which crosstalk does not occur between photocouplers can be efficiently obtained by the manufacturing method described above which uses the first metal mold In the above embodiment, although an optoelectronic device having four photocouplers has been described, two, three, or five or more photocouplers may equally be used.

Further, although the first and the second metal molds were used to manufacture the optoelectronic device, the optoelectronic device may equally be manufactured using only the second metal mold. In this case, the pair of the lead frames is set in the second metal mold. Then, a light path is provided between each pair of the facing light emitting elements 21 and the light receiving elements 22 by introducing translucid resin therebetween. After that, the package 23 is formed by charging resin having light interrupting properties into the metal mold. Opaque silicone resin may be used as material for the package 23.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An optoelectronic device comprising:
    a plurality of light emitting elements for converting electric signals into optical signals;

light receiving elements, provided so as to respectively face the light emitting elements, for reconverting the optical signals into electric signals;

a lead frame made of a thin metal plate, whereon the light receiving elements are fixed, the lead frame being connected by wires to ground electrodes provided on the light receiving elements; and a plurality of ground terminals common to the light receiving elements, the plurality of ground terminals being integrated with the lead.

2. The optoelectronic device as set forth in claim 1, wherein
the ground terminals are two in number.

3. The optoelectronic device as set forth in claim 1, wherein
inner packages, made of translucid resin, separately seal each pair of the facing light emitting elements and the light receiving elements; and a package, made of resin having light interrupting properties, entirely seals all the inner packages.

4. The optoelectronic device as set forth in claim 1, wherein
a light path formed by translucid resin is provided between each pair of the facing light emitting elements and the light receiving elements, each of the light emitting elements, the light receiving elements and the light path provided therebetween being entirely sealed by a package made of resin having light interrupting properties.

5. The optoelectronic device as set forth in claim 1, wherein the lead frame comprises:
a first elongated member extending along an axis of elongation and having a plurality of the light receiving elements mounted thereon in spaced-apart relation along the axis of elongation, a first electrode of each of the light receiving elements being connected by wire bonding to the first elongated member;

at least two ground leads extending from the first elongated member in a direction substantially orthogonal to the axis of elongation, the ground leads being the ground terminals;

a plurality of peninsular leads extending toward the first elongated member in a direction substantially orthogonal to the axis of elongation, each peninsular lead corresponding to an associated one of the light receiving elements and being connected by wire bonding to a second electrode of the associated light receiving element; and, a second elongated member extending in a direction parallel to the axis of elongation of the first elongated member, the second elongated member having at least two bridge leads extending therefrom in a direction substantially orthogonal to the axis of elongation, a third electrode of each of the light receiving elements being connected by wire bonding to the second elongated member.

6. The device of claim 5, wherein for each light receiving element the first electrode is a ground electrode, the second electrode is an output electrode, and the third electrode is a power electrode.

7. The device of claim 5, wherein with respect to a direction orthogonal to the axis of elongation of the first elongated member, the first elongated member is positioned intermediate the second elongated member and the peninsular leads.

8. The device of claim 5, wherein with respect to a direction parallel to the axis of elongation of the first elongated member, a plurality of the peninsular leads are positioned intermediate the ground leads.

9. The device of claim 5, wherein the first elongated member has four light receiving elements mounted thereon, wherein with respect to a direction parallel to the axis of elongation of the first elongated member, at least two peninsular leads are positioned intermediate the ground leads which connect the first elongated member to the tie bar.

10. The device of claim 5, wherein with respect to a direction parallel to the axis of elongation of the first elongated member, the ground leads connect the first elongated member to the tie member and the peninsular leads are positioned intermediate two bridge leads which connect the second elongated member to the tie bar.

11. The device of claim 5, wherein the first elongated member has apertures formed therein between the light receiving elements.

12. The device of claim 11, wherein the first elongated member has a plurality of apertures formed therein between the light receiving elements.

13. The device of claim 11, wherein the apertures have an essentially rectangular shape.

14. The device of claim 11, wherein the apertures have an essentially circular shape.

15. The device of claim 5, wherein the first elongated member, the second elongated member, the bridge members, and the peninsular members are all formed from a thin metal plate.

16. An optoelectronic device comprising:
a plurality of light emitting elements for converting electric signals into optical signals;

a plurality of light receiving elements, provided so as to respectively face the light emitted from a corresponding one of the light emitting elements, for reconverting the optical signals into electric signals into electric signals;

a lead frame whereon the light receiving elements are mounted, the lead frame comprising an elongated thin metal plate extending along an axis of elongation, at least two spaced-apart ground leads integrally provided on the lead frame and extending in a direction substantially orthogonal to the axis of elongation, the ground leads being the ground terminals;

at least two other leads extending toward the elongated thin metal plate and in a direction substantially orthogonal to the axis of elongation and being at least partially co-planar with the thin metal plate, a first of the other leads being connected by wire bonding to a power electrode of at least one of the light receiving elements and a second of the other leads being connected by wire bonding to an output electrode of at least one of the light receiving elements; and, a resin package in which the metal plate and the two other leads are sealed in fixed relationship with one another.

17. The device of claim 16, further comprising:
a second elongated member extending in a direction parallel to the axis of elongation of the first elongated member, the second elongated member having the first of said other leads extending therefrom in a direction substantially orthogonal to the axis of elongation, the power electrode of each of the light receiving elements being connected by wire bonding to the second elongated member.

18. The device of claim 17, wherein with respect to a direction orthogonal to the axis of elongation of the first elongated member, the first elongated member is positioned intermediate the second elongated member and the ground leads.

19. The device of claim 16, wherein with respect to a direction parallel to the axis of elongation of the first elongated member, at least one of the other leads is positioned intermediate the two ground leads.

20. The device of claim 16, wherein the first elongated member has apertures formed therein between the light receiving elements.

21. The device of claim 11, wherein the first elongated member has a plurality of apertures formed therein between the light receiving elements.

* * * * *